United States Patent
Aaen et al.

(10) Patent No.: US 9,312,817 B2
(45) Date of Patent: Apr. 12, 2016

(54) SEMICONDUCTOR PACKAGE DESIGN PROVIDING REDUCED ELECTROMAGNETIC COUPLING BETWEEN CIRCUIT COMPONENTS

(75) Inventors: Peter H. Aaen, Phoenix, AZ (US);
David J. Dougherty, Tempe, AZ (US);
Manuel F. Romero, Chandler, AZ (US);
Lakshminarayan Viswanathan, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/554,034

(22) Filed: Jul. 20, 2012

(65) Prior Publication Data

US 2014/0022020 A1   Jan. 23, 2014

(51) Int. Cl.
| | | |
|---|---|---|
| H03F 3/20 | (2006.01) | |
| H03F 1/02 | (2006.01) | |
| H03F 3/195 | (2006.01) | |
| H03F 3/24 | (2006.01) | |
| H01L 23/552 | (2006.01) | |
| H01L 23/66 | (2006.01) | |

(52) U.S. Cl.
CPC ............ *H03F 1/0288* (2013.01); *H01L 23/552* (2013.01); *H01L 23/66* (2013.01); *H03F 3/195* (2013.01); *H03F 3/245* (2013.01); *H01L 2223/6644* (2013.01); *H01L 2224/49175* (2013.01); *H01L 2924/3011* (2013.01)

(58) Field of Classification Search
CPC ...................... H01L 2924/3025; H01L 23/552; H01L 23/66; H01L 24/85; H01L 2224/49175; H01L 2924/3011; H03F 3/20; H03F 3/195
USPC .................................................. 257/699–723
See application file for complete search history.

(56) References Cited

U.S. PATENT DOCUMENTS

| | | | | |
|---|---|---|---|---|
| 5,668,408 | A | * | 9/1997 | Nicholson ..................... 257/699 |
| 6,072,211 | A | | 6/2000 | Miller et al. |
| 6,261,868 | B1 | | 7/2001 | Miller et al. |
| 7,429,790 | B2 | | 9/2008 | Condie et al. |
| 7,445,967 | B2 | | 11/2008 | Abdo et al. |
| 7,446,411 | B2 | | 11/2008 | Condie et al. |

(Continued)

OTHER PUBLICATIONS

Non-Final Office Action mailed Dec. 4, 2014 for U.S. Appl. No. 13/929,688, 8 pages.

(Continued)

*Primary Examiner* — Jerome Jackson, Jr.
*Assistant Examiner* — Fang-Xing Jiang
(74) *Attorney, Agent, or Firm* — Sherry W. Schumm

(57) ABSTRACT

A single semiconductor device package that reduces electromagnetic coupling between elements of a semiconductor device embodied within the package is provided. For a dual-path amplifier, such as a Doherty power amplifier, an isolation feature that separates carrier amplifier elements from peaking amplifier elements is included within the semiconductor device package. The isolation feature can take the form of a structure that is constructed of a conductive material coupled to ground and which separates the elements of the amplifier. The isolation feature can be included in a variety of semiconductor packages, including air cavity packages and over-molded packages. Through the use of the isolation feature provided by embodiments of the present invention a significant improvement in signal isolation between amplifier elements is realized, thereby improving performance of the dual-path amplifier.

12 Claims, 6 Drawing Sheets

(56) References Cited

U.S. PATENT DOCUMENTS

| | | |
|---|---|---|
| 8,030,763 B2 | 10/2011 | Romero et al. |
| 9,007,129 B2 | 4/2015 | van Zuijlen et al. |
| 2007/0172990 A1 | 7/2007 | Abdo et al. |
| 2008/0048777 A1 | 2/2008 | Kohjiro et al. |
| 2009/0322430 A1* | 12/2009 | Romero .................. H01L 23/66 330/286 |
| 2011/0001587 A1 | 1/2011 | Sutardja |
| 2012/0038420 A1* | 2/2012 | Won ........................ H03F 3/195 330/195 |
| 2015/0002226 A1* | 1/2015 | Meen Kuo .............. H01L 24/85 330/295 |
| 2015/0002229 A1 | 1/2015 | Kuo et al. |

OTHER PUBLICATIONS

Final Office Action mailed May 15, 2015 for U.S. Appl. No. 13/929,688, 9 pages.

Final Office Action mailed Aug. 20, 2015 for U.S. Appl. No. 13/929,688, 8 pages.

Restriction Requirement mailed Nov. 5, 2014 for U.S. Appl. No. 14/261,387, 5 pages.

Non-Final Office Action mailed May 26, 2015 for U.S. Appl. No. 14/261,387, 14 pages.

Office Action, Notice of Allowance mailed Sep. 29, 2015 for U.S. Appl. No. 14/261,387, 12 pages.

* cited by examiner

SEMICONDUCTOR PACKAGE DESIGN PROVIDING REDUCED ELECTROMAGNETIC COUPLING BETWEEN CIRCUIT COMPONENTS

BACKGROUND

1. Field

This disclosure relates generally to semiconductor packages, and more specifically, to a semiconductor package providing reduced coupling between components included in a single semiconductor device package.

2. Related Art

Wireless communication systems often employ power amplifiers for increasing power of a signal. A power amplifier is usually designated as the last amplifier in a transmission chain (the output stage) and it is the amplifier stage that typically demands the most attention to power efficiency. In general, a power amplifier is designed to operate at maximum power efficiency when the power amplifier transmits peak output power. But power efficiency worsens as output power decreases, and modern communications standards typically employ signals operating at an average power that is lower than the amplifier's peak output power. In order to address power efficiency concerns, the Doherty power amplifier technique has been the focus of attention for both base stations and mobile terminals because of high power-added efficiency at all power levels.

A Doherty power amplifier typically includes two or more amplifiers (e.g., a "carrier amplifier" and a "peaking amplifier"). But a dual-path amplifier architecture, such as that for a Doherty amplifier, presents unique challenges in terms of semiconductor package design. The performance of a dual-path amplifier can be adversely perturbed, for example, by electromagnetic coupling (that is, the transfer of energy from one circuit component to another through a shared magnetic or electric field) between adjacent bond wire arrays of corresponding components of the amplifier. Coupling can be of two types, electric (i.e., capacitive coupling) and magnetic (i.e., inductive coupling). Inductive or magnetic coupling occurs when a varying magnetic field exists between current carrying conductors that are in close proximity to one another, thus inducing a voltage across the receiving conductor.

Space demands within typical wireless communication systems require the various components of those systems to consume minimal space. But placing both the carrier amplifier and peaking amplifier of a Doherty power amplifier in the same package results in the undesirable coupling discussed above. It is therefore desirable to provide a single semiconductor device package for a dual-path amplifier, such as a Doherty power amplifier, that reduces or eliminates the electromagnetic coupling between the elements of the amplifier.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Figure 1:
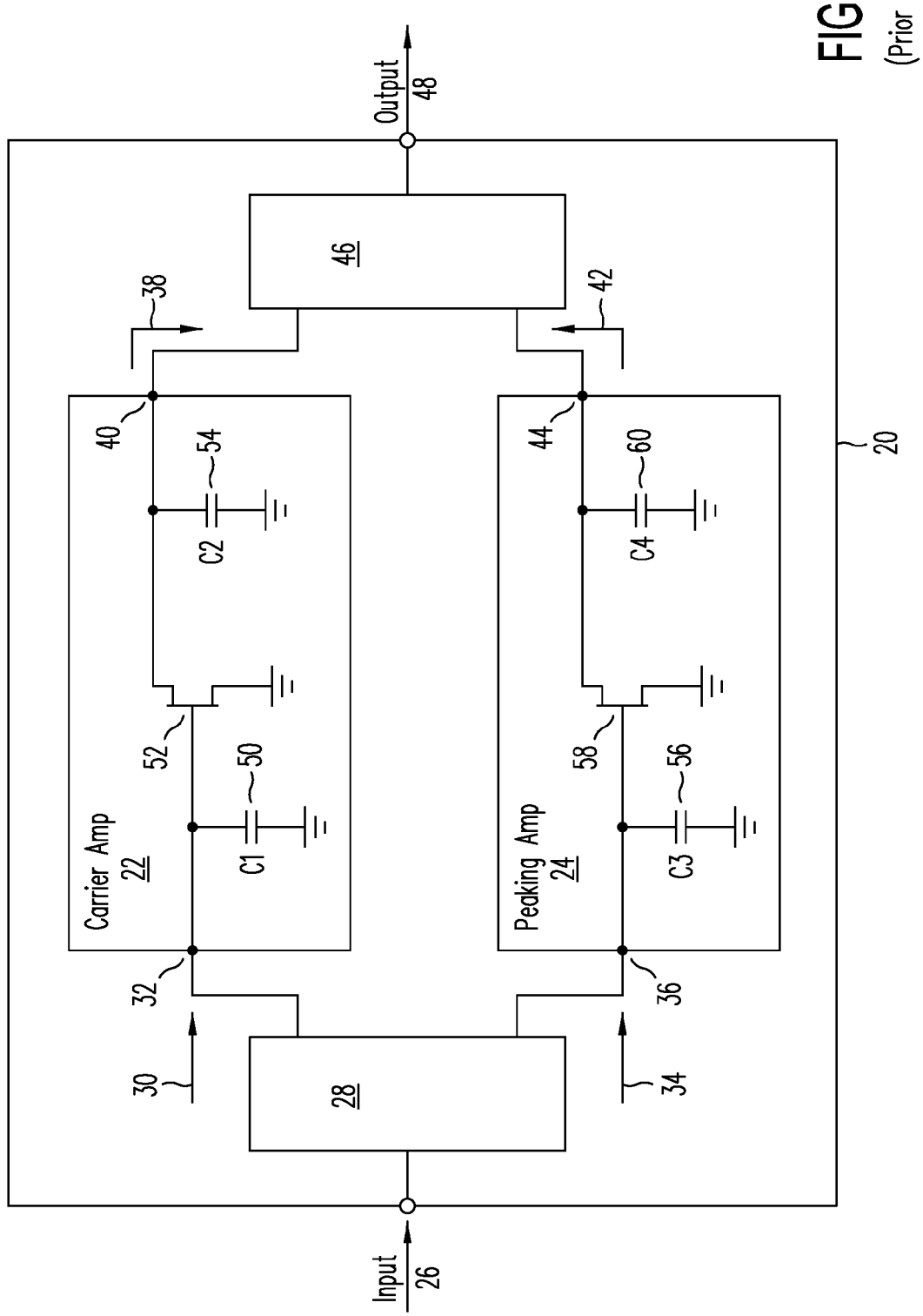
FIG. 1 is a simplified block diagram of an example of a dual-path amplifier circuit.

Embodiments of the present invention provide a single semiconductor device package that reduces electromagnetic coupling between elements of a semiconductor device embodied within the package. For a dual-path amplifier, such as a Doherty power amplifier, an isolation feature that separates carrier amplifier elements from peaking amplifier elements is included within the semiconductor device package. The isolation feature can take the form of a structure that is constructed of a conductive material coupled to ground and which separates the elements of the amplifier. The isolation feature can be included in a variety of semiconductor packages, including air cavity packages and overmolded packages. Through the use of the isolation feature provided by embodiments of the present invention a significant improvement in signal isolation between amplifier elements is realized, thereby improving performance of the dual-path amplifier.

One example of a dual-path amplifier that can benefit from embodiments of the present invention is a Doherty power amplifier. A Doherty power amplifier typically includes two or more amplifiers: a "carrier amplifier" and a "peaking amplifier." The amplifiers are typically connected with their outputs joined by an offset transmission line that performs impedance transformation. The peaking amplifier delivers current as the carrier amplifier saturates, thereby reducing the impedance seen at the output of the carrier amplifier. Thus, the carrier amplifier delivers more current to the load while it is saturated because of the "load-pulling" effect. Since the carrier amplifier remains close to saturation, a Doherty power amplifier is able to transmit peak output power as the peaking amplifier saturates so that the total efficiency of the system remains high.

In the past, dual-path amplifier semiconductor package design called for the utilization of discrete devices and integrated circuits (e.g., one that formed the carrier amplifier and another that formed the peaking amplifier of a Doherty power amplifier). The discrete devices were maintained at a sufficient distance apart in order to limit cross talk between the carrier and peaking amplifiers. One source of cross talk in any semiconductor package architecture is between arrays of signal wires (e.g., "bond wire arrays") used to electrically couple the electrical devices in components of the package (e.g., in each of the carrier and peaking amplifiers of a Doherty power amplifier). Performance of a dual-path amplifier can be adversely affected by such coupling between the corresponding components of the amplifier. Embodiments of the present invention reduce or eliminate this coupling in a single package design.

While illustrated embodiments throughout the present application provide examples of a Doherty power amplifier, it should be understood that embodiments of the present invention are not limited to just Doherty power amplifier applications. Benefits of the present invention can be realized in any dual-path amplifier and in any application needing a reduction in electromagnetic coupling between signal carrying or signal producing circuit elements that are in close proximity.

FIG. 1 is a simplified block diagram of an example Doherty power amplifier circuit. Doherty power amplifier circuit 20 includes a carrier amplifier circuit 22 and a peaking amplifier circuit 24 connected in parallel. An input signal 26 is split into two signals by an input splitter 28. A resulting carrier input signal 30 is provided to an input port 32 of carrier amplifier circuit 22, and peaking input signal 34 is provided to an input port 36 of peaking amplifier circuit 24. A carrier output signal 38 is provided from an output port 40 of carrier amplifier circuit 22. Similarly, a peaking output signal 42 is provided from an output port 44 of peaking amplifier circuit 22. Carrier output signal 38 is power combined with peaking output signal 42 through a power combiner 46 to produce a combined output signal 48. Those skilled in the art will understand that Doherty power amplifiers typically include additional electronic devices and circuitry that are not shown in FIG. 1 for simplicity of illustration.

In one embodiment, carrier amplifier circuit 22 is configured to be active for an entire range of output power of the Doherty power amplifier. Peaking amplifier circuit 24 is configured to be active only when carrier amplifier circuit 22 saturates. Power combiner 46, in one embodiment, is a quarter-wave impedance converter. The quarter-wave impedance converter can add a ninety degree lag to carrier output signal 38 (e.g., current). The phase of peaking amplifier circuit 24 is typically designed to lag carrier amplifier circuit 22 by ninety degrees so that the two output signals 38 and 42 (e.g., current) add in phase when output signals 38 and 42 are combined at the output of power combiner 46 to form combined output signal 48.

Each of carrier amplifier circuit 22 and peaking amplifier circuit 24 can include a number of active and passive electrical devices. For example, carrier amplifier circuit 22 includes a capacitor 50, labeled C1, coupled to input node 32, which receives carrier input signal 30. Capacitor 50 is coupled to the gate of transistor 52, which applies an appropriate amplification to input signal 30. An output of transistor 52 is coupled to another capacitor 54, labeled C2. Capacitors 50 and 54 are configured to condition carrier input signal 30 prior to amplification and to the amplified signal immediately after amplification.

Similarly, peaking amplifier circuit 24 includes a capacitor 56, labeled C3, which is coupled to input node 36 and which receives input signal 34. Capacitor 56 is also coupled to the gate of transistor 58, which applies an appropriate amplification to peaking input signal 34. An output of transistor 58 is coupled to another capacitor 60, labeled C4. As with capacitors 50 and 54, capacitors 56 and 60 function to condition peaking input signal 34 prior to amplification and to the amplified signal immediately after amplification. Those skilled in the art will recognize that carrier amplifier circuit 22 and peaking amplifier circuit 24 can include additional electronic devices that are not shown in FIG. 1 for simplicity of illustration.

In a semiconductor package design for Doherty power amplifier 20, the various electrical devices can be connected using multiple parallel signal wires (e.g., bond wire arrays). In a practical application, one or more of the signal paths of carrier amplifier circuit 22, for example, between input node 32 and capacitor 50, between capacitor 50 and transistor 52, between transistor 52 and capacitor 54, and between capacitor 54 and output node 40 can be implemented as bond wire arrays. Similarly, one or more of the signal paths of peaking amplifier circuit 24 between the input/output nodes, and the capacitors and transistor can be implemented as bond wire arrays.

In a dual-path semiconductor package design for Doherty power amplifier 20, the various bond wire arrays may be placed in very close proximity to one another as a result of being packaged in a single housing. The small distances between the signal paths of the bond wire arrays leads to significant levels of electrical coupling.

Figure 2:
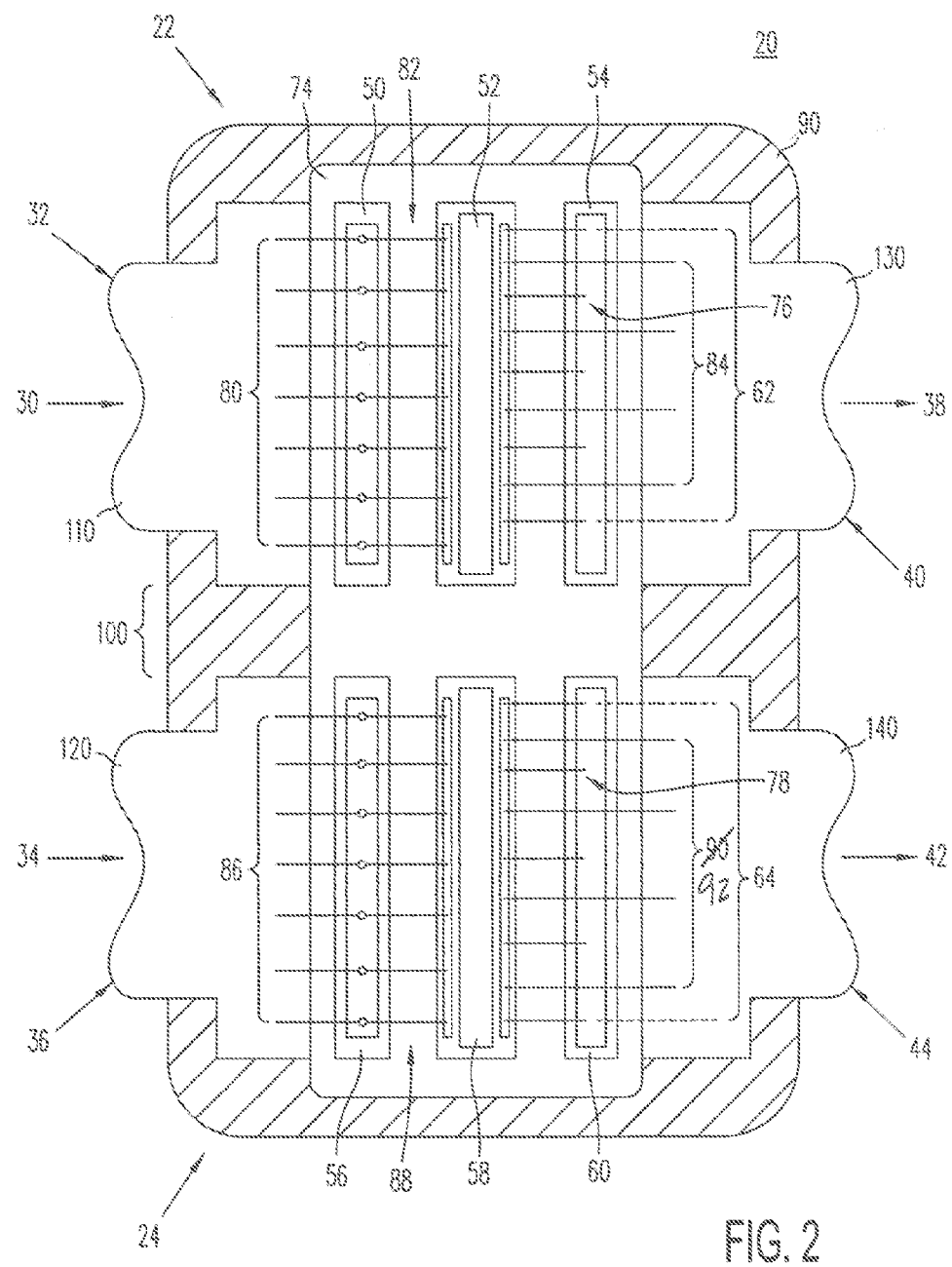
FIG. 2 illustrates a top schematic view of carrier and peaking amplifier circuits of a Doherty power amplifier configured in a dual-path semiconductor package.

FIG. 2 illustrates a top schematic view of carrier and peaking amplifier circuits 22 and 24 of Doherty power amplifier 20 configured in a dual-path semiconductor package. The illustrated semiconductor package is an air cavity package design, provided by way of example. Capacitors 50, 54, 56, and 60, as well as transistors 52 and 58, are semiconductor devices manufactured and subsequently mounted to a surface of a common carrier, such as a package ground plane ("flange") 74. Capacitors 50, 54, 56, and 60 can be, for example, metal-oxide-semiconductor (MOS) capacitors mounted on package ground plane 74. Signal wires 76 of bond wire array 62 interconnect transistor 52 with capacitor 54. Similarly, signal wires 78 of bond wire array 64 interconnect transistor 58 with capacitor 60.

Doherty power amplifier 20 includes additional bond wire arrays. A bond wire array 80 interconnects input node 32 of carrier amplifier circuit 22 with capacitor 50. Another bond wire array 82 interconnects capacitor 50 with an input of transistor 52. Bond wire array 84 (having longer signal wires then signal wires 76 of bond wire array 62) can bypass capacitor 54 to interconnect transistor 52 with additional electrical devices, not shown for simplicity of illustration. Similarly, a bond wire array 86 interconnects input node 36 of peaking amplifier circuit 24 with capacitor 56, and another bond wire array 88 interconnects capacitor 56 with an input of a transistor 58. Bond wire array 92 (having longer signal wires than signal wires 78 of bond wire array 64) can bypass capacitor 60 to interconnect transistor 58 with additional electrical devices, again not shown for simplicity of illustration.

In the illustrated embodiment, the symmetrical layout of carrier and peaking amplifier circuits 22 and 24 results in components of carrier amplifier circuit 22 being adjacent to corresponding components of peaking amplifier circuit 24. Accordingly, the arrangement of carrier amplifier signal wires 76 of bond wire array 62, for example, are adjacent to and geometrically parallel with the peaking amplifier signal wires 78 of bond wire array 64. Bond wire arrays 62 and 64 need not be geometrically parallel, but may instead be offset or angled relative to one another. It is the close proximity and symmetry between the amplifier circuits that leads to the high levels of inductive coupling between the carrier and peaking amplifier circuits.

FIG. 2 illustrates additional components of a typical air cavity package design. As discussed above, the transistors and capacitors of the carrier and peaking amplifiers are mounted on the surface of package ground plane, or flange, 74. And insulating isolator 90 is adhesively mounted or formed on the ground plane, and includes an opening over the mounted transistors and capacitors. A set of input and output pads are then adhesively mounted or formed on isolator 90, which decouples the pads from the package ground plane. Input pads 110 and 120 are physical conductors for input nodes 32 and 36, respectively. Similarly, output pads 130 and 140 provide physical conductors for output nodes 40 and 42, respectively.

Bracket 100 represents a coupling region between the components of carrier amplifier 22 and peaking amplifier 24. In this region, electromagnetic fields generated by current carried in conductors in the bond wire arrays (e.g., 80, 62, and 84, and 86, 64, and 92) closest to the coupling region are propagated and can interact with conductors on the opposing side of the coupling region to generate inductive currents.

Figure 3:
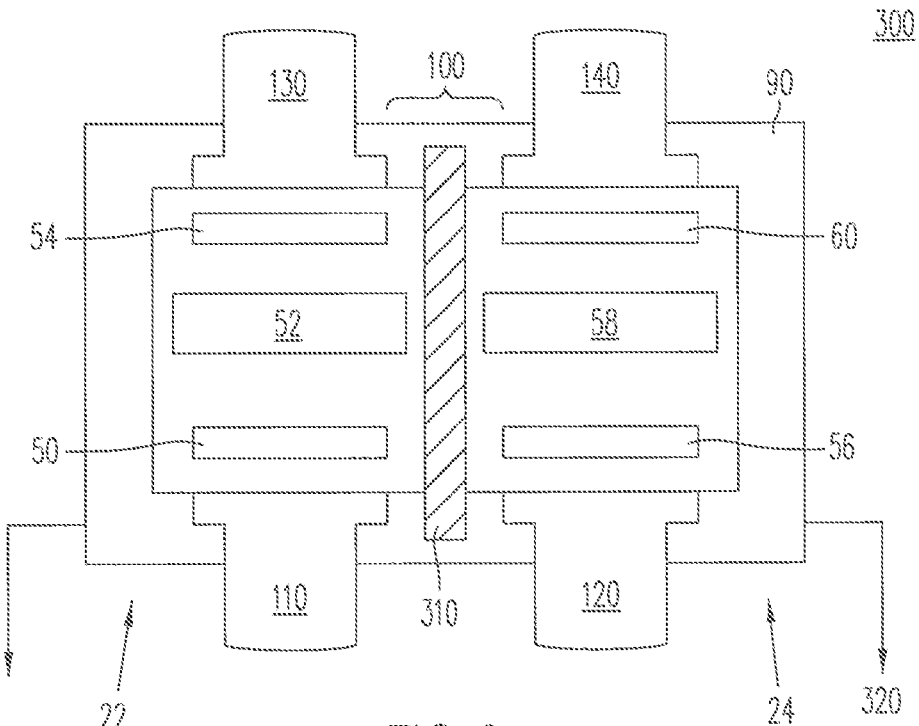
FIG. 3 provides a simplified block diagram illustrating a mechanism by which the coupling between the carrier and peaking amplifier circuits is reduced, in accord with embodiments of the present invention.

FIG. 3 is a simplified block diagram illustrating a mechanism by which the conductive coupling between the carrier and peaking amplifier circuits is reduced, in accord with embodiments of the present invention. FIG. 3 provides an air cavity semiconductor package 300 that includes the components of the semiconductor package illustrated in FIG. 2. The various bond wire arrays are not shown in FIG. 3 for sake of simplicity. FIG. 3 illustrates the addition of a separator 310 placed within coupling region 100. Separator 310 improves electromagnetic isolation between carrier amplifier 22 and peaking amplifier 24. Separator 310 provides electromagnetic isolation by being made of or including a conductive material, such as copper, aluminum, titanium, metal alloys, and the like. Alternatively, separator 310 can be a circuit board material that has been metalized or metalized in a pattern that is tuned to a frequency being isolated (e.g., a mesh pattern). Embodiments of the present invention are not limited to the type of conductive material used to provide electrical isolation.

Figure 4:
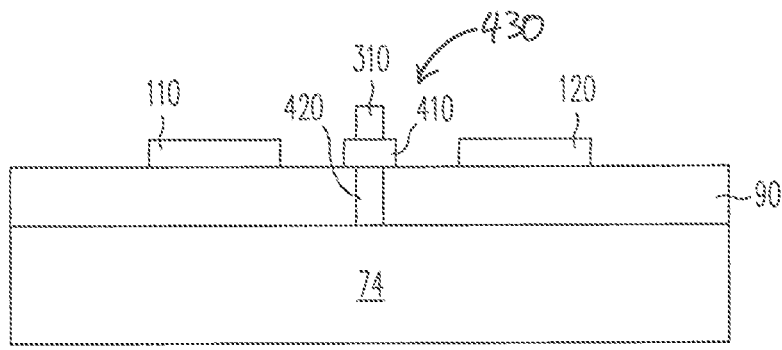
FIG. 4 is a simplified block diagram illustrating a cross-section of one embodiment of an air cavity semiconductor package, as illustrated in FIG. 3.

FIG. 4 is a simplified block diagram illustrating one embodiment of a cross-section of air cavity semiconductor package 300 taken at plane 320, as illustrated in FIG. 3. In this embodiment, separator 310 is electrically coupled to a separator grounding pad 410. Separator grounding pad 410 can be provided to the semiconductor device package during the same step as that providing carrier input pad 110 and peaking input pad 120, for example. Separator grounding pad 410 is electrically coupled to flange 74 by means of a through via 420. Through via 420 is formed through isolator 90 either during formation of isolator 90 or subsequent to the attachment of isolator 90 to flange 74 (e.g., using laser drilling or other methods known in the art). Air cavity semiconductor package 300 provides an air cavity, as indicated by the presence of air 430.

Figure 5:
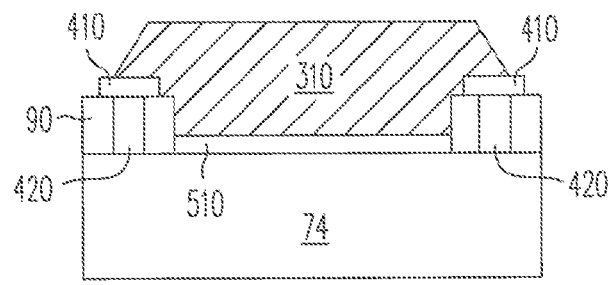
FIG. 5 is a simplified block diagram illustrating a cross section of the embodiment of FIG. 4 taken at a plane through the separator.

FIG. 5 is a simplified block diagram illustrating the embodiment of FIG. 4 of air cavity semiconductor package 300 taken at a plane through separator 310. FIG. 5 illustrates separator 310 electrically coupled to flange 74 by means of separator grounding pads 410 and through vias 420, at each end of separator 310. In addition, separator 310 is adhesively coupled to flange 74 by means of attach material 510. Attach material 510 can be conductive, thereby providing another means for separator 310 to be grounded to flange 74. Attach material 510 can be any material appropriate to the application, including, for example, conductive epoxy, solder, brazed join within package. In addition, separator 310 can be grounded on an external printed circuit board using an extra lead attached to the separator.

FIGS. 4 and 5 illustrate a mechanism by which separator 310 can be grounded within the semiconductor package itself. That is, by grounding separator 310 to flange 74. In this manner, the floating ground provided to the separator results in an electrical isolation between the carrier and peaking amplifiers. Alternatively, separator grounding pads 410 can be coupled to a ground connection outside semiconductor device package 300. In this manner, the package ground can be fixed to an environmental ground to provide electrical isolation.

Figure 6:
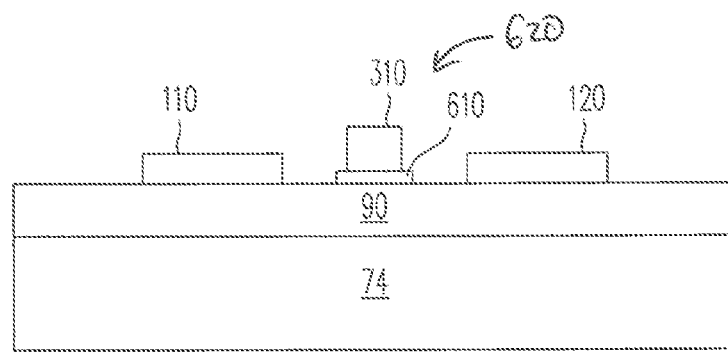
FIG. 6 is a simplified block diagram illustrating a cross-section of another embodiment of an air cavity semiconductor package, as illustrated in FIG. 3.

FIG. 6 is a simplified block diagram illustrating another embodiment of a cross-section of air cavity semiconductor package 300 taken at plane 320, as illustrated in FIG. 3. In this embodiment, separator 310 is adhesively coupled to isolator 90 by means of attach material 610. Unlike the embodiment in FIG. 4, no path to ground is provided through isolator 90. The air cavity of air cavity semiconductor package 300 is illustrated by the presence of air 620.

Figure 7:
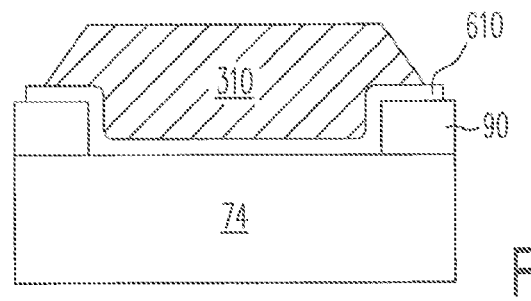
FIG. 7 is a simplified block diagram illustrating a cross section of the embodiment of FIG. 6 taken at a plane through the separator.

FIG. 7 is a simplified block diagram illustrating the embodiment of FIG. 6 of air cavity semiconductor package 300 taken at a plane through separator 310. FIG. 7 illustrates separator 310 being adhesively coupled to flange 74 along the length of separator 310 by means of attach material 610. As with FIG. 5, attach material 610 can be conductive, thereby providing a means for separator 310 to be grounded to flange 74. Alternatively, separator 310 can be attached using a non-conductive attach material and then electrically coupled to an external ground (e.g., using extra leads attached to separator 310).

Figure 8:
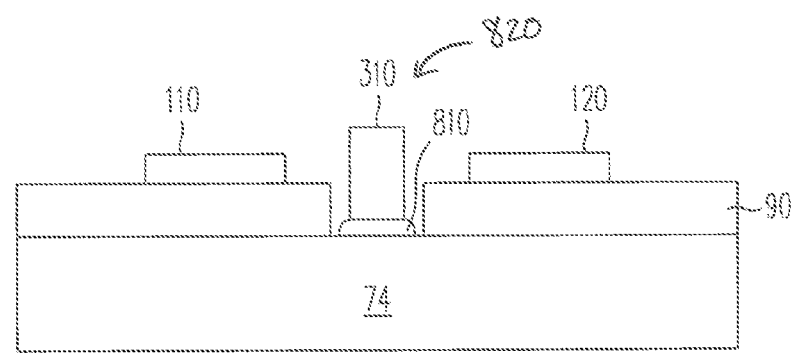
FIG. 8 is a simplified block diagram illustrating a cross-section of another embodiment of an air cavity semiconductor package, as illustrated in FIG. 3.

FIG. 8 is a simplified block diagram illustrating another embodiment of a cross section of air cavity semiconductor package 300 taken at plane 320, as illustrated in FIG. 3. In this embodiment, a gap is formed in isolator 90 in coupling region 100. The gap can be formed either subsequent to the formation of isolator 90 on flange 72 (e.g., by trenching) or by forming isolator 90 in two pieces with the gap between the pieces on the flange. Separator 310 can then be adhesively coupled to flange 72 using attach material 810. The air cavity of air cavity semiconductor package 300 is illustrated by the presence of air 820.

Figure 9:
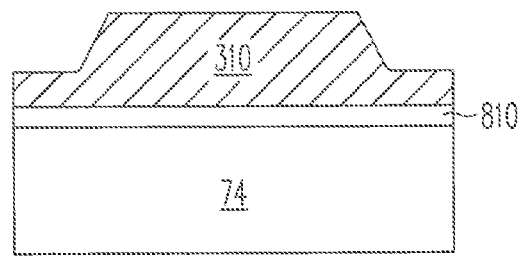
FIG. 9 is a simplified block diagram illustrating a cross section of the embodiment of FIG. 8 taken at a plane through the separator.

FIG. 9 is a simplified block diagram illustrating the embodiment of FIG. 8 of air cavity semiconductor package 300 taken at a plane through separator 310. FIG. 9 illustrates separator 310 as adhesively coupled to flange 74 using attach material 810. In this embodiment, separator 310 extends to the flange in the region where the gap in isolator 90 is located. As discussed above, attach material 810 can be conductive, thereby providing a means for separator 310 to be grounded to flange 74. Attach material 810 can be the same as or different than attach material 510 or 610.

Since embodiments of the present invention are intended to provide the advantages of increased efficiency without increasing the size of current semiconductor device packages, dimensions of the separator should be such that the separator can be incorporated in current semiconductor device packages. In one embodiment, the separator can be a metallic "wall" measuring approximately 5 mils or approximately 100 microns, thick. The height of the separator can be approximately the same height as the bond wires in the bond wire arrays of the carrier and peaking amplifiers, and the width of the separator can be less than or equal to the width of the semiconductor device package. In the embodiment illustrated in FIGS. 8 and 9, the "gap" formed in isolator 90 should be sufficient to enable placement of the separator, while still providing for typical circuit formation. In one embodiment, the gap can be approximately 20 mils, or approximately 500 microns, thick.

While the above discussion has focused on embodiments incorporated in an air cavity semiconductor package, the advantages of the present invention are not limited to air cavity packages. Dual-path amplifiers can also be incorporated in overmolded semiconductor packages. By doing so, the dual-path amplifier can take advantage of the better thermal conductivity, higher reliability, space saving, and environmental friendliness aspects of overmolded semiconductor packages.

Figure 10:
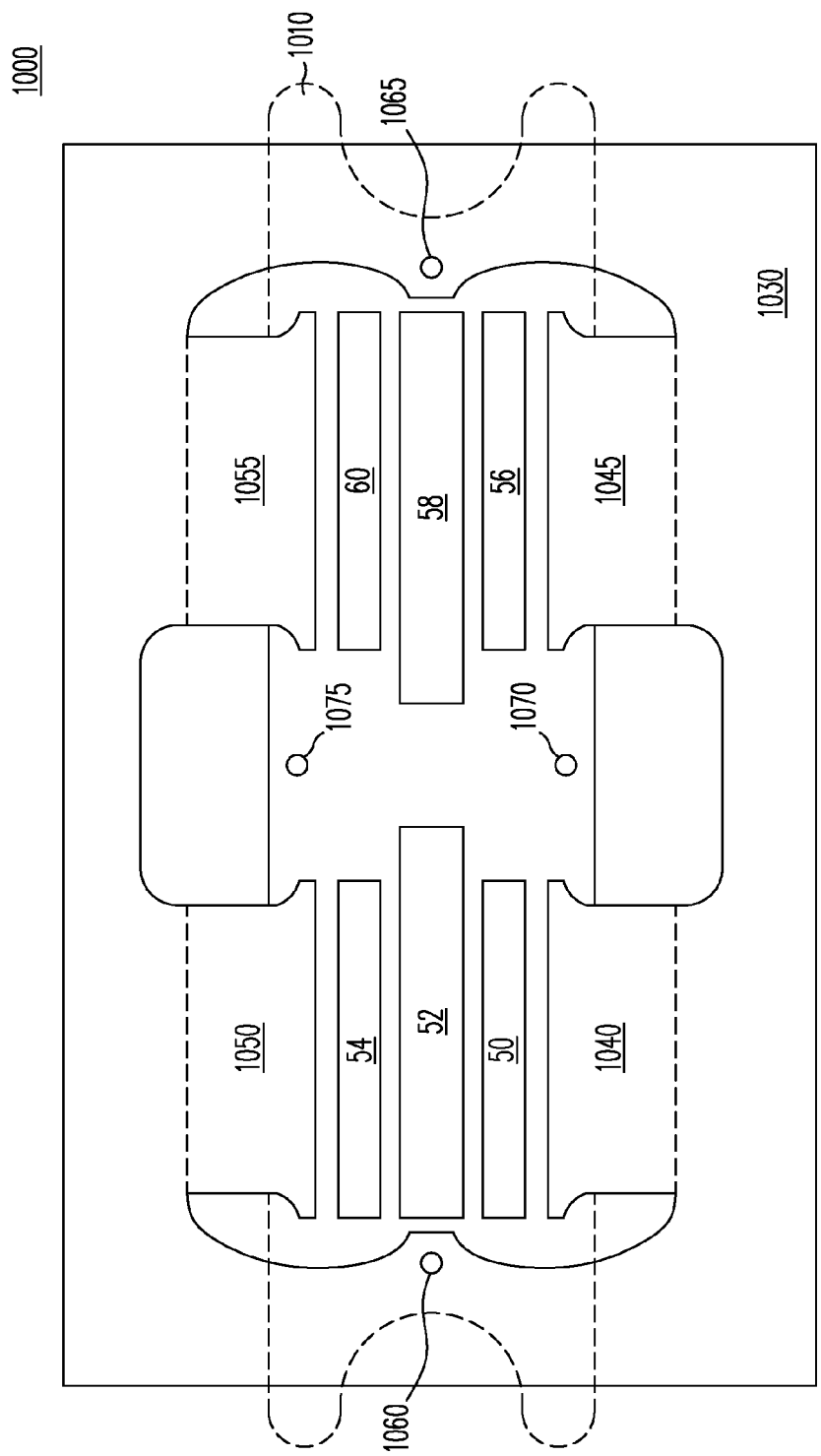
FIG. 10 is a simplified block diagram illustrating an overmolded semiconductor package at an assembly stage, in accord with embodiments of the present invention.

FIG. 10 is a simplified block diagram illustrating an overmolded semiconductor package 1000 at a stage in assembly, in accord with embodiments of the present invention. A flange 1010 is provided on which the components of a carrier amplifier and peaking amplifier are attached. As illustrated, capacitors 50 and 54 and transistor 52 of carrier amplifier 22 and capacitors 56 and 60 and transistor 58 of peaking amplifier 24 are attached to flange 1010. These components of the carrier and peaking amplifiers can be attached using methods understood for overmolded semiconductor packaging, including using a lead-free attach material. As with the illustration of FIG. 3, the various bond wire arrays are not shown in FIG. 10 for sake of simplicity.

After coupling the carrier amplifier and peaking amplifier components to flange 1010, lead frame 1030 is coupled to flange 1010 using a staking process. Examples of a staking process include a high precision mechanical staking process, laser joining process, or spot welding process. In one example of a high precision mechanical staking process, stakes 1060 and 1065 can be inserted into holes in lead frame 1030 and in corresponding features of flange 1010, in order to precisely couple together the lead frame and the flange. Lead frame 1030 and flange 1010 can be electrically insulated from one another by, for example, insulating the features in lead frame 1030 such that after the staking process electrical isolation is maintained. In the illustrated embodiment, lead frame 1030 includes carrier amplifier input pad 1040, peaking amplifier input pad 1045, carrier amplifier output pad 1050, and peaking amplifier output pad 1055.

Additional features are provided in flange 1010. Features 1070 and 1075 are provided to allow placement of a separator between the carrier and peaking amplifiers of the example Doherty power amplifier.

Figure 11:
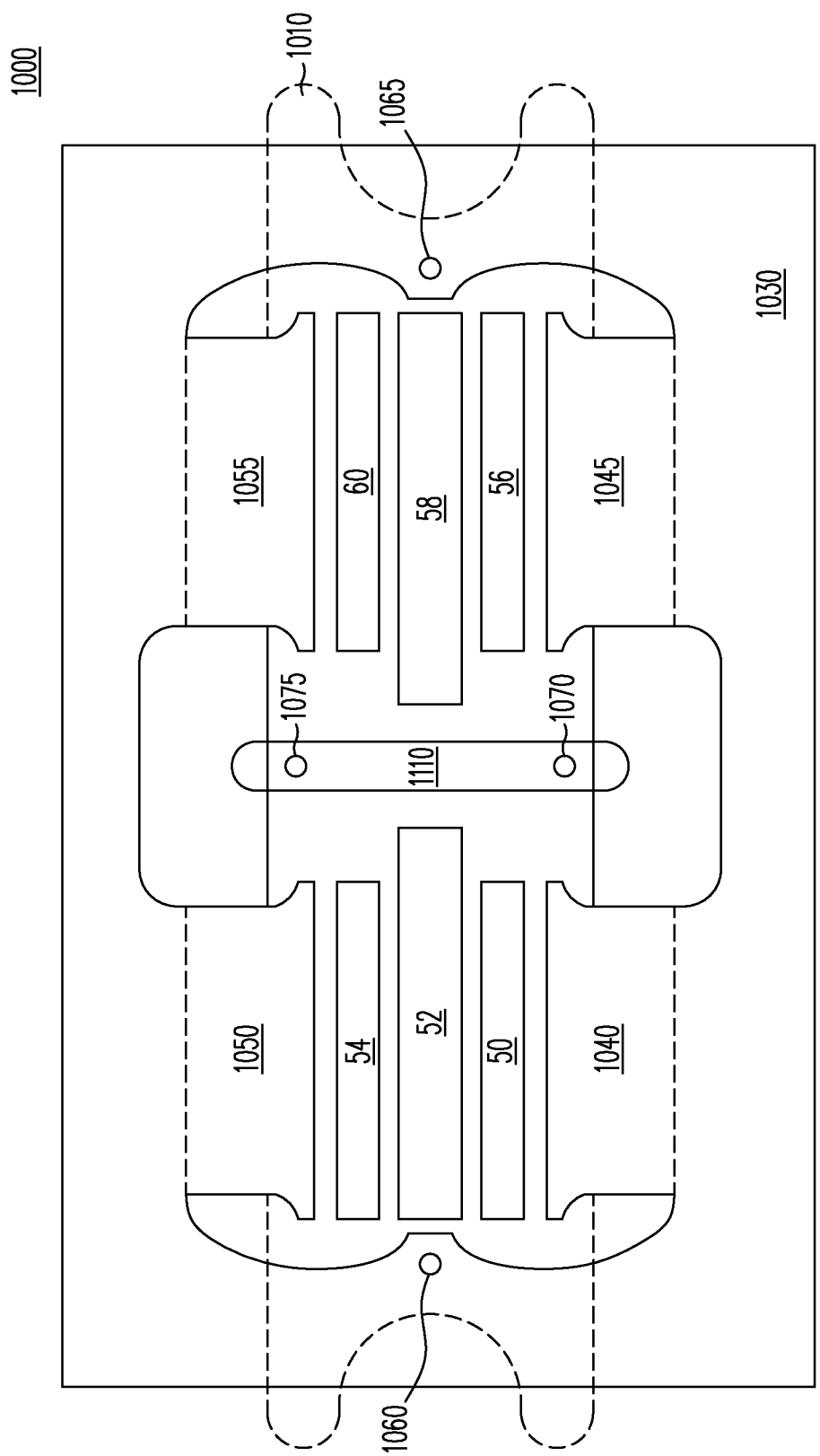
FIG. 11 is a simplified block diagram illustrating the overmolded semiconductor package from FIG. 10 at a further stage in assembly, in accord with embodiments of the present invention.

FIG. 11 is a simplified block diagram illustrating the overmolded semiconductor package from FIG. 10 at a further stage in assembly, in accord with embodiments of the present invention. A separator frame 1110 is coupled to flange 1010 using a staking process similar to that discussed with regard to FIG. 10. Separator frame 1110 is aligned with features 1070 and 1075 in the coupling region between the carrier and peaking amplifiers. In one embodiment, separator frame 1110 is a metallic lead frame that provides a conductive "wall" between the amplifier circuits, which has a height sufficient to electrically decouple respective components of the amplifiers. In another embodiment, separator frame 1110 can be formed from the same metal as lead frame 1030, but by twisting the separator frame portion 90 degrees from the plane of the lead frame and staking the twisted portion in the flange features.

Standard overmolded package processing steps can continue to be performed on the assembled embodiment of FIG. 11. For example, a plastic material (not shown) can be overmolded on at least a portion of the flange, amplifier components, lead frame, separator frame, and interconnect structure. Features of the various components, and the stakes, can serve as mold locks to improve adhesion of the plastic material to the flange. Once the overmolding material has cured, lead frame 1030 can be singulated by cutting tie and dam bars of the lead frame, such that the input/output pads are no longer electrically coupled together by the lead frame.

As with the air cavity semiconductor packages, the dimensions of the "wall" formed by separator frame 1110 are selected such that the dimensions of the finished semiconductor device package do not significantly diverge from the dimensions of an overmolded semiconductor device package not incorporating embodiments of the invention.

By reducing coupling between the separate amplifier components of a dual-path amplifier, embodiments of the present invention exhibit improvements in signal isolation for both forward coupling and reverse coupling of the amplifiers. That is, isolation is improved across the inputs of the amplifiers (e.g., carrier amplifier input pad 110 to peaking amplifier input pad 120 of the illustrated Doherty power amplifier), as well as between the input of one amplifier and the output of the other amplifier (e.g., carrier amplifier input pad 110 to peaking amplifier output pad 140. In one test embodiment, operational frequency improvement in reverse coupling was greater than 10 dB. Choices of material for a separator "wall" can be made in light of the application (e.g., different frequencies and package dimensions may require different metallic materials for optimal isolation improvement). It should be understood that embodiments of the present invention are not limited to the packages, dimensions, and materials discussed herein.

By now it should be appreciated that a semiconductor device package has been provided that includes: a flange; a first set of circuit components mounted on the flange wherein a first and second component of the first set of circuit components are coupled by a first set of conductors; a second set of circuit components mounted on the flange, wherein a first and second component of the second set of circuit components are coupled by a second set of conductor; and, an electromagnetic isolation structure mounted on the flange and located between the first and second sets of conductors. One or more conductor of the first conductors are located sufficiently close to the second conductors to induce a current in one or more conductor of the second set of conductors when a current is passed through the one or more conductor of the first set of conductors, in the absence of the electromagnetic isolation structure.

In one aspect of the above embodiment, the electromagnetic isolation structure is of a length sufficient to separate the first and second sets of circuit components. In another aspect of the above embodiment, a height of the electromagnetic isolation structure is at least a height of the highest conductor of the first and second sets of conductors. In yet another aspect of the above embodiment, the electromagnetic isolation structure comprises one of copper, aluminum, titanium, or a metal alloy. In still another aspect of the above embodiment, the electromagnetic isolation structure includes a metalized printed circuit board. In a further aspect, the metalized printed circuit board is metalized in a pattern that optimizes electromagnetic shielding between the first and second sets of circuit components at an operational frequency of the first and second sets of circuit components.

In another aspect of the above embodiment, the electromagnetic isolation structure is adhesively coupled to the flange using an attach material. In a further aspect, the attach material is conductive. In another further aspect, the attach material is an insulator and the electromagnetic isolation structure is electrically coupled to a ground external to the semiconductor device package.

In another aspect, the semiconductor device package also includes an electrical isolator over the perimeter of the flange, where a portion of the electromagnetic isolation structure is mounted over a portion of the electrical isolator. In a further aspect, the semiconductor device package also includes a through via, formed in the electrical isolator, and configured to electrically couple the electromagnetic isolation structure to the flange. In another further aspect, the semiconductor device package is an air cavity semiconductor device package.

In another aspect of the above embodiment, the semiconductor device package is an overmolded semiconductor device package and the electromagnetic isolation structure is mounted on the flange using a staking technique. In a further aspect, the electromagnetic isolation structure is formed from a metallic frame structure.

In another aspect of the above embodiment, the semiconductor device package includes a Doherty power amplifier with the first set of circuit components being a carrier amplifier circuit and the second set of circuit components being a peaking amplifier circuit. In a further aspect, a wireless communication device includes the Doherty power amplifier semiconductor device package.

Another embodiment provides a dual-path amplifier semiconductor package that includes: a flange; a first amplifier portion mounted on the flange and including a first array of first conductors electrically coupling one or more elements of the first amplifier portion; a second amplifier portion mounted on the flange and including a second array of second conductors electrically coupling one or more elements of the second amplifier portion, where the first amplifier portion is located adjacent to the second amplifier portion, the first array of first conductors is located proximate to the second array of second conductors; and, an electromagnetic isolation structure that is adhesively mounted to the flange and located between the first array of first conductors and the second array of second conductors.

In one aspect of the above embodiment, the electromagnetic isolation structure further includes a metal including one of copper, aluminum, titanium, or a metal alloy. In another aspect of the above embodiment, the electromagnetic isolation structure includes a metalized printed circuit board and the printed circuit board is metalized using a pattern that optimizes electromagnetic shielding between the first array of first conductors and the second array of second conductors at an operational frequency of the first and second amplifier portions. In yet another aspect of the above embodiment, the electromagnetic isolation structure is electrically coupled to one of the flange by virtue of a conductive adhesive or a conductive via, or to a ground external to the dual-path amplifier semiconductor package.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, differing semiconductor package types can be used in conjunction with embodiments of the present invention. In addition, while illustrative embodiments are provided in light of a Doherty power amplifier, embodiments of the present invention can be used in other semiconductor applications for which reduced electromagnetic coupling is desirable. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a flange;
   a first set of circuit components mounted on the flange, wherein
      a first circuit component and a second circuit component of the first set of circuit components are coupled by a first set of conductors,
      the first circuit component of the first set of circuit components comprises a transistor,
      the second circuit component of the first set of circuit components comprises a capacitor, and
      the semiconductor device package comprises a Doherty power amplifier and the first set of circuit components comprises a carrier amplifier circuit;
   a second set of circuit components mounted on the flange, wherein
      a first circuit component and a second circuit component of the second set of circuit components are coupled by a second set of conductors,
      the first circuit components of the first set of circuit components comprises a transistor,
      the second circuit component of the first set of circuit components comprises a capacitor, and
      the second set of circuit components comprises a peaking amplifier circuit; and
   an electromagnetic isolation structure located between the first set of conductors and the second set of conductors, wherein the electromagnetic isolation structure is adhesively coupled directly to the flange, the first set of conductors and the second set of conductors are bond wire arrays, and one or more conductors of the first set of conductors are located sufficiently close to the second set of conductors to induce a current in one or more conductor of the second set of conductors when a current is passed through the one or more conductor of the first set of conductors in the absence of the electromagnetic isolation structure wherein a height of the electromagnetic isolation structure is higher than the highest conductor of the first and second sets of conductors.

2. The semiconductor device package of claim 1 wherein the electromagnetic isolation structure has a dimension in the region between the first and second sets of conductors sufficient to electromagnetically shield the one or more conductor of the second set of conductors from the one or more conductor of the first set of conductors.

3. The semiconductor device package of claim 1 wherein the electromagnetic isolation structure comprises one of copper, aluminum, titanium, or a metal alloy.

4. The semiconductor device package of claim 1 wherein the electromagnetic isolation structure comprises a metalized circuit board material.

5. The semiconductor device package of claim 4 wherein the metalized printed circuit board is metalized in a pattern that optimizes electromagnetic shielding between the first and second sets of circuit components at an operational frequency of the first and second sets of circuit components.

6. The semiconductor device package of claim 1 wherein the electromagnetic isolation structure is adhesively coupled to the flange using an attach material.

7. The semiconductor device package of claim 6 wherein the attach material is conductive.

8. The semiconductor device package of claim 6, wherein the attach material is an insulator, and the electromagnetic isolation structure is electrically coupled to a ground external to the semiconductor device package.

9. The semiconductor device package of claim 1 further comprising:

an electrical isolator over the perimeter of the flange, wherein a portion of the electromagnetic isolation structure is mounted over a portion of the electrical isolator; and a through via, formed in the electrical isolator, and configured to electrically couple the electromagnetic isolation structure to the flange.

10. The semiconductor device package of claim 9 wherein the semiconductor device package comprises an air cavity semiconductor device package.

11. The semiconductor device package of claim 1, wherein the semiconductor device package comprises an overmolded semiconductor device package, and the electromagnetic isolation structure is mounted on the flange using a staking technique.

12. The semiconductor device package of claim 11 wherein the electromagnetic isolation structure is formed from a metallic frame structure.

* * * * *